United States Patent
Peng

(10) Patent No.: US 11,202,384 B2
(45) Date of Patent: Dec. 14, 2021

(54) WATERPROOF MECHANISM

(71) Applicant: Qisda Corporation, Taoyuan (TW)

(72) Inventor: Chih-Kang Peng, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/747,608

(22) Filed: Jan. 21, 2020

(65) Prior Publication Data

US 2020/0253072 A1 Aug. 6, 2020

(30) Foreign Application Priority Data

Jan. 31, 2019 (CN) .......................... 201910099117.2

(51) Int. Cl.
H05K 5/06 (2006.01)
(52) U.S. Cl.
CPC ............. H05K 5/061 (2013.01); H05K 5/069 (2013.01)
(58) Field of Classification Search
CPC .......... H05K 5/061; H05K 5/069; H05K 5/06; H02G 3/088; H02G 3/08; H02G 15/013
See application file for complete search history.

(56) References Cited

U.S. PATENT DOCUMENTS

| 2015/0035418 A1* | 2/2015 | Shiu ....................... H05K 5/069 |
| | | 312/223.1 |
| 2015/0098200 A1* | 4/2015 | Spangberg ........... H05K 7/1427 |
| | | 361/752 |
| 2015/0189775 A1* | 7/2015 | Kanchiku ............ H01R 13/405 |
| | | 361/807 |
| 2017/0254700 A1* | 9/2017 | Mizusaki ................ G01S 17/04 |
| 2019/0174646 A1* | 6/2019 | Ko .......................... H02G 3/083 |
| 2019/0254188 A1* | 8/2019 | Cmich .................. H05K 5/0204 |
| 2019/0373751 A1* | 12/2019 | Chiang .................. H05K 5/061 |

FOREIGN PATENT DOCUMENTS

| CN | 102984905 A | 3/2013 |
| JP | 2003031967 A | 1/2003 |
| JP | 2004265748 A | 9/2004 |

OTHER PUBLICATIONS

Office action of counterpart application by SIPO dated Dec. 15, 2020.

* cited by examiner

*Primary Examiner* — Timothy J Thompson
*Assistant Examiner* — Amol H Patel

(57) ABSTRACT

The present invention discloses a waterproof mechanism including a first casing, a second casing, a waterproof strip and a wire. The first casing includes a first frame. The second casing includes a second frame having a groove in which the waterproof strip is disposed. The wire is interposed between the first casing and the second casing and engaged with the first frame and the second frame, wherein the wire is pressed by the waterproof strip.

11 Claims, 7 Drawing Sheets

WATERPROOF MECHANISM

This application claims the benefit of People's Republic of China Application No. 201910099117.2, filed Jan. 31, 2019, the disclosure of which is incorporated by reference herein in its entirety.

BACKGROUND OF THE INVENTION

Field of the Invention

The invention relates in general to a waterproof mechanism, and more particularly to a waterproof mechanism adaptable to miniaturized devices.

Description of the Related Art

Electronic devices are very sensitive to moisture. In the absence of a specially designed structure configured to prevent the infiltration of moisture, the electronic devices may easily be damaged and the lifespan will be reduced.

For some electronic devices with wires (such as network devices, antenna devices, and display devices), a waterproof ring is disposed around the jack. When the wire is inserted into the jack, the waterproof ring is screwed and fixed between the plug and the jack to prevent moisture infiltrating the inside of the electronic devices.

However, for the electronic devices to provide a waterproof effect through the disposition of the waterproof ring, an extra height is required. Therefore, the electronic devices need to have a certain size and cannot be miniaturized.

SUMMARY OF THE INVENTION

The invention is directed to a waterproof mechanism allowing the wire to be interposed between an upper casing and a lower casing and engaged with the two frames of the two casings, such that the electronic devices using the waterproof mechanism can meet the waterproof requirement under the condition of miniaturization.

According to an embodiment of the present invention, a waterproof mechanism is provided. The waterproof mechanism includes a first casing, a second casing, a waterproof strip and a wire. The first casing includes a first frame. The second casing includes a second frame, the second frame has a groove in which the waterproof strip is disposed. The wire is interposed between the first casing and the second casing and engaged with the first frame and the second frame, wherein the wire is pressed by the waterproof strip.

According to another embodiment of the present invention, a waterproof mechanism is provided. The waterproof mechanism includes a first casing, the second casing and the first wire. The first casing includes a first frame. The first frame includes a first inner retaining wall having an opening portion. The second casing includes a second frame. The first wire is interposed between the first casing and the second casing and engaged with the first frame and the second frame. The first wire includes a first engaging structure. The first engaging structure includes a first engaging portion. The first engaging portion has a shape matching the opening portion and is received in the opening portion, such that the first engaging portion and the first inner retaining wall together form a closed retaining wall.

In comparison to the prior art, the waterproof mechanism of the present invention does not require a closed jack to disposed on the frame of the casing for the wire to be horizontally inserted into the jack. Conversely, according to the waterproof mechanism of the present invention, the casing is divided into an upper casing and a lower casing that can be coupled together, and the wire is interposed between the two casings and engaged with the two frames of the two casings to provide a waterproof effect. The design of the waterproof mechanism of the present invention is different from the conventional design. Therefore, the waterproof mechanism of the present invention enables the electronic devices using the waterproof mechanism to meet the waterproof requirement under the condition of miniaturization.

The above and other aspects of the invention will become better understood with regards to the following detailed description of the preferred but non-limiting embodiment(s). The following description is made with reference to the accompanying drawings.

DETAILED DESCRIPTION OF THE INVENTION

For the objects, structures, technical features and functions of the present invention to be more easily understood by anyone ordinary skilled in the technology field, a number of exemplary embodiments are disclosed below with detailed descriptions and accompanying drawings.

The present invention relates to a waterproof mechanism. The waterproof mechanism includes a first casing, a second casing and a wire. The first casing includes a first frame. The second casing includes a second frame. In some embodiments, the waterproof mechanism further includes a waterproof strip disposed in the groove of the second frame, wherein the wire is interposed between the first casing and the second casing and engaged with the first frame and the second frame. Meanwhile, the wire is pressed by the waterproof strip. In some other embodiments, the first frame includes a first inner retaining wall having an opening portion. The wire includes an engaging structure. The engaging structure includes an engaging portion whose shape matches the opening portion. The wire is interposed between the first casing and the second casing and engaged with the first frame and the second frame. Meanwhile, the engaging portion of the wire is exactly received in the opening portion, such that the engaging portion and the first inner retaining wall together form a closed retaining wall. Through the above arrangements, the electronic devices using the waterproof mechanism can meet the waterproof requirement under the condition of miniaturization.

It should be noted that although the present disclosure does not illustrate all possible embodiments, other embodiments not disclosed in the present disclosure are still applicable. Moreover, the dimension scales used in the accompanying drawings are not based on actual proportion of the product. Therefore, the specification and drawings are for explaining and describing the embodiment only, not for limiting the scope of protection of the present disclosure. Furthermore, descriptions of the embodiments, such as detailed structures, manufacturing procedures and materials, are for exemplification purpose only, not for limiting the scope of protection of the present disclosure. Suitable modifications or changes can be made to the structures and procedures of the embodiments to meet actual needs without breaching the spirit of the present disclosure. Designations common to the accompanying drawings are used to indicate identical or similar elements.

Figure 1:
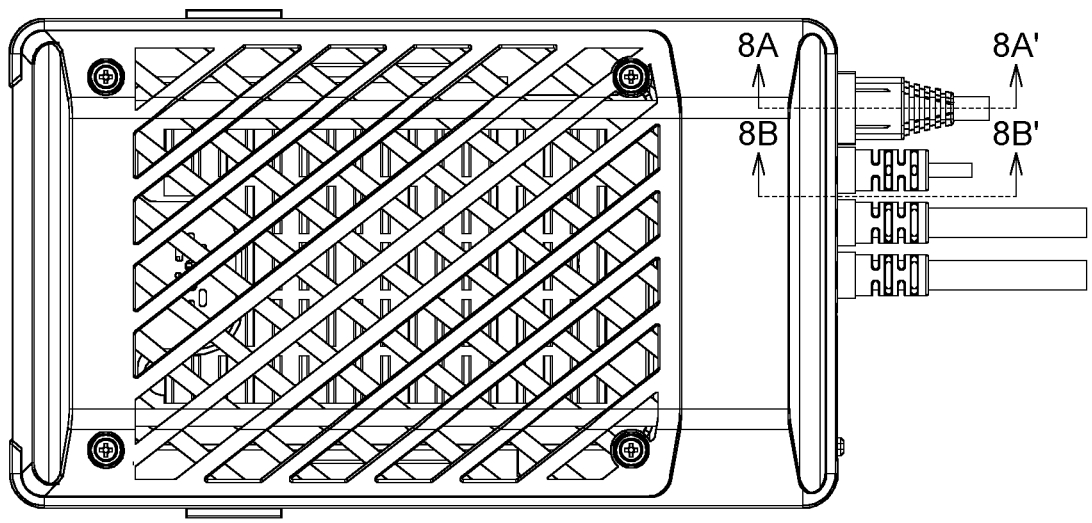
FIG. 1 is a top view of a waterproof mechanism according to an embodiment of the present invention.

Referring to FIG. 1, a top view of a waterproof mechanism 1 according to an embodiment of the present invention is shown. The waterproof mechanism 1 can be used in some miniaturized electronic devices, such as vehicle electronic devices, interconnected hosts, display devices and antenna devices to provide a waterproof effect. The electronic devices that can use the waterproof mechanism of the present invention are not limited to the above exemplifications.

Figure 2:
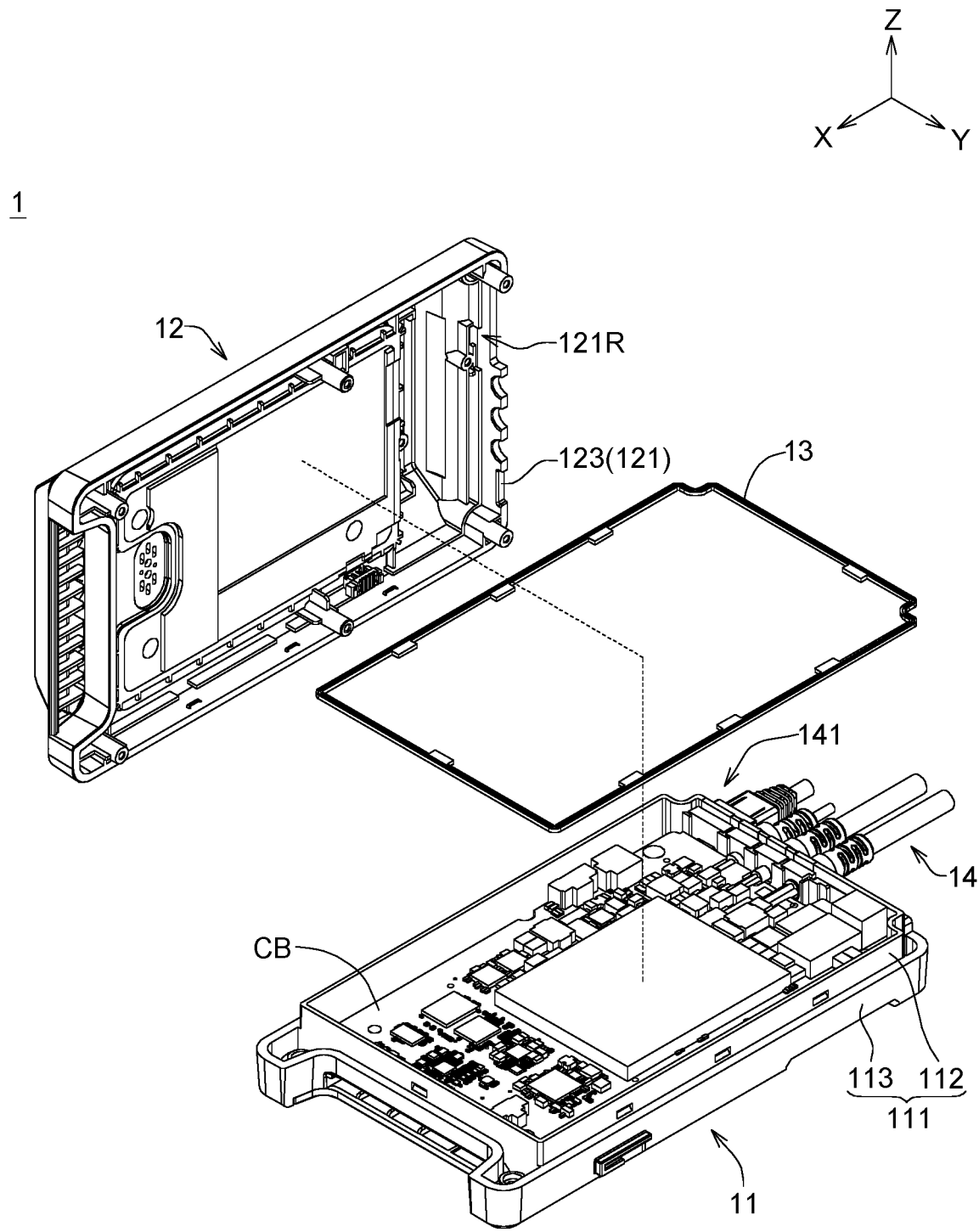
FIG. 2 is an explosion diagram of a waterproof mechanism according to an embodiment of the present invention.

Referring to FIG. 2, an explosion diagram of a waterproof mechanism 1 according to an embodiment of the present invention is shown. The waterproof mechanism 1 includes a first casing 11, a second casing 12 and at least one wire 14. Based on actual needs, multiple wires 14 can be used. The first casing 11 includes a first frame 111 surrounding the first casing 11 to protect the electronic elements inside the first casing 11, such as the circuit board CB. The second casing 12 includes a second frame 121 surrounding the second casing 12 and corresponding to the first frame 111 of the first casing 11.

During assembly, the second casing 12 is coupled to the first casing 11, and the second casing 12 and the first casing 11 are fixed together. For example, the second casing 12 is coupled to the first casing 11 using screws or other methods. When the first casing 11 and the second casing 12 are coupled together, the wire 14 is interposed between the first casing 11 and the second casing 12 and engaged with the first frame 111 and the second frame 121.

The waterproof mechanism 1 may further include a waterproof strip 13 whose shape is a closed ring. Correspondingly, the second frame 121 of the second casing 12 has a groove 121R whose shape and position correspond to that of the waterproof strip 13, such that the waterproof strip 13 can be disposed in the groove 121R. When the first casing 11 and the second casing 12 are coupled together, the wire 14 is pressed by the waterproof strip 13.

Specifically, the wire 14 can be engaged with the first frame 111 of the first casing 11 through the engaging structure 141. For example, the wire 13 is tightly engaged with the first frame 111. The engaging structure 141 can be formed of a soft thermo-plastic material having a certain level of elasticity and strength. On the other hand, the waterproof strip 13 is disposed in the groove 121R of the second frame 121 of the second casing 12. Then, when the first casing 11 and the second casing 12 are coupled together, the wire 14 can be engaged with the second frame 121 of the second casing 12 through the engaging structure 141, and the waterproof strip 13 tightly presses the wire 14 to achieve a waterproof effect or a dustproof effect.

Figure 3:
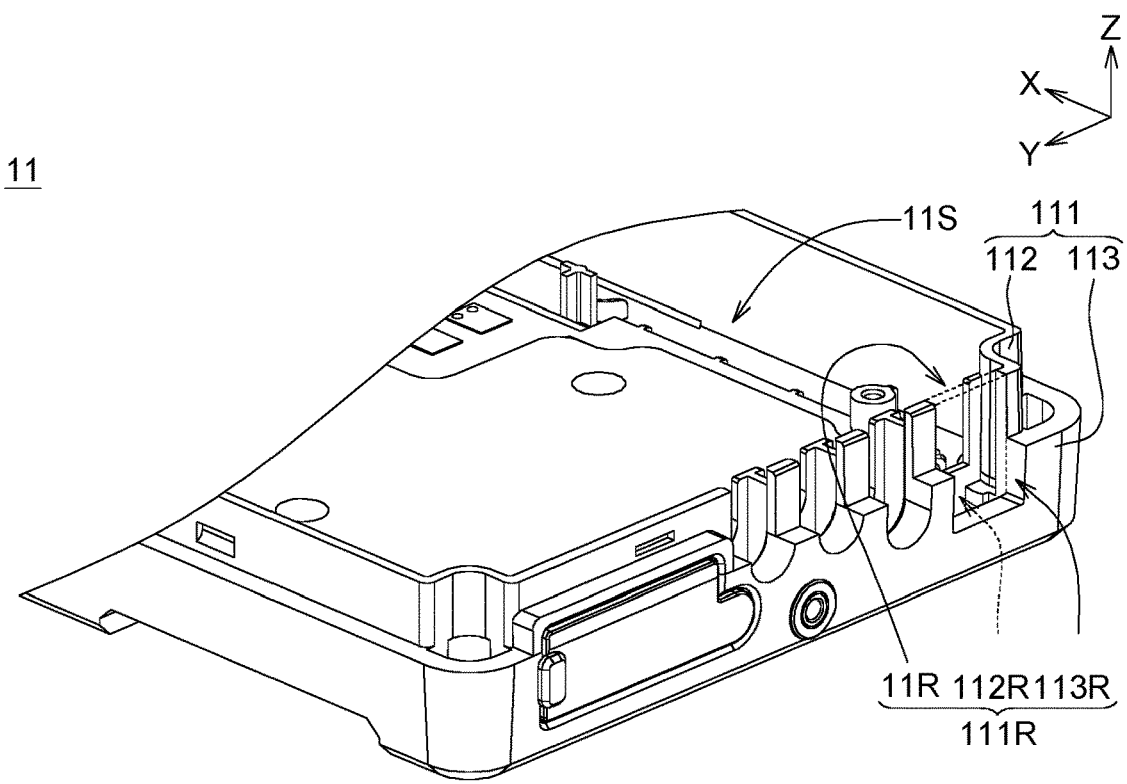
FIG. 3 is a 3D diagram of a first casing of a waterproof mechanism according to an embodiment of the present invention, wherein the 3D diagram illustrates partial structural details of the first casing.
Figure 4:
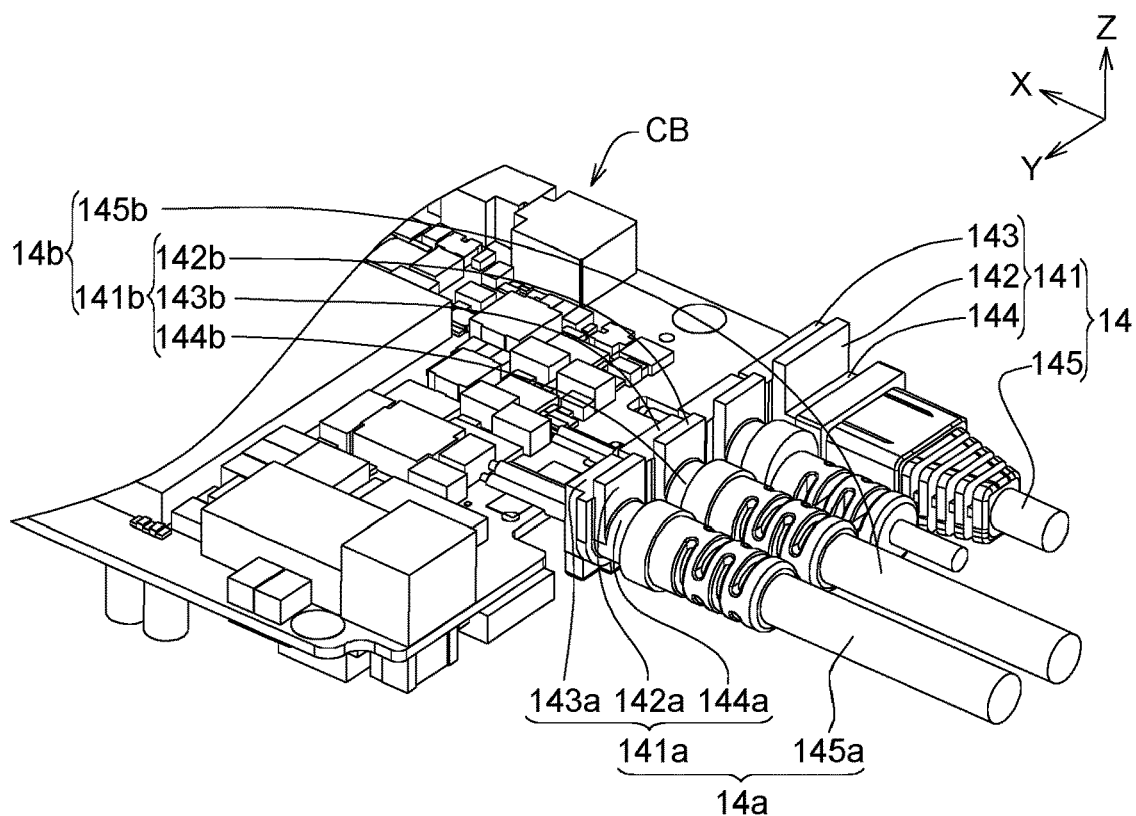
FIG. 4 is a 3D diagram of a wire of a waterproof mechanism connected to a circuit board according to an embodiment of the present invention, wherein the 3D diagram illustrates partial structural details of the wire.

FIG. 3 is a 3D diagram of a first casing 11 of a waterproof mechanism 1 according to an embodiment of the present invention, wherein the 3D diagram illustrates partial structural details of the first casing 11. FIG. 4 is a 3D diagram of a wire 14 of a waterproof mechanism 1 connected to a circuit board CB according to an embodiment of the present invention, wherein the 3D diagram illustrates partial structural details of the wire.

Refer to FIG. 3. The first frame 111 of the first casing 11 may include a first inner retaining wall 112 and a first outer retaining wall 113. The first outer retaining wall 113 is closer to the periphery than the first inner retaining wall 112. Moreover, the first inner retaining wall 112 is connected to and higher than the first outer retaining wall 113. For example, the first inner retaining wall 112 can be projected from the first outer retaining wall 113 and extended upward in the positive direction of the Z-axis.

Refer to FIG. 3 and FIG. 4. The first frame 111 may have a receiving portion 111R having a notch facing the positive direction of the Z-axis for receiving the engaging structure 141 of the wire 14. Specifically, the receiving portion 111R has a shape matching the engaging structure 141, such that the engaging structure 141 of the wire 14 can be exactly received in the receiving portion 111R via the notch of the receiving portion 111Re and b engaged with the first frame 111.

As indicated in FIG. 3, the first inner retaining wall 112 may have at least one opening portion 112R, and the first inner retaining wall 112, excluding the opening portion 112R, forms a closed wall. The first outer retaining wall 113 may have at least one bearing portion 113R corresponding to the opening portion 112R. The quantities of the opening portion 112R and the bearing portion 113R depend on the quantity of the wire 14. The opening portion 112R and the bearing portion 113R can form the receiving portion 111R for receiving the engaging structure 141 of the wire 14.

Refer to FIG. 4. The wire 14 includes an engaging structure 141 and a trace 145. The engaging structure 141 may include an engaging portion 142 and a clamping portion 144. The engaging portion 142 corresponds to the opening portion 112R of FIG. 3 and has a shape matching the opening portion 112R as indicated in a dotted region of FIG. 3. The clamping portion 144 corresponds to the bearing portion 113R of FIG. 3.

As indicated in FIG. 4, each wire 14 is connected to the circuit board CB to transmit signals. For example, each wire 14 is electrically connected to the circuit board CB by way of welding. Thus, the process of additionally disposing a socket on a lateral side of the circuit board CB can be omitted. The first casing 11 and the second casing 12 are coupled together to form an accommodation space for receiving the circuit board CB. That is, the accommodation space can be located in the first casing 11 or the second casing 12. Or, one part of the accommodation space is located in the first casing 11 and the other part is located in the second casing 12. In an embodiment as indicated in FIG. 3, the first casing 11 has an accommodation space 11S for receiving the circuit board CB. The accommodation space 11S and the receiving portion 111R are interconnected.

Figure 5:
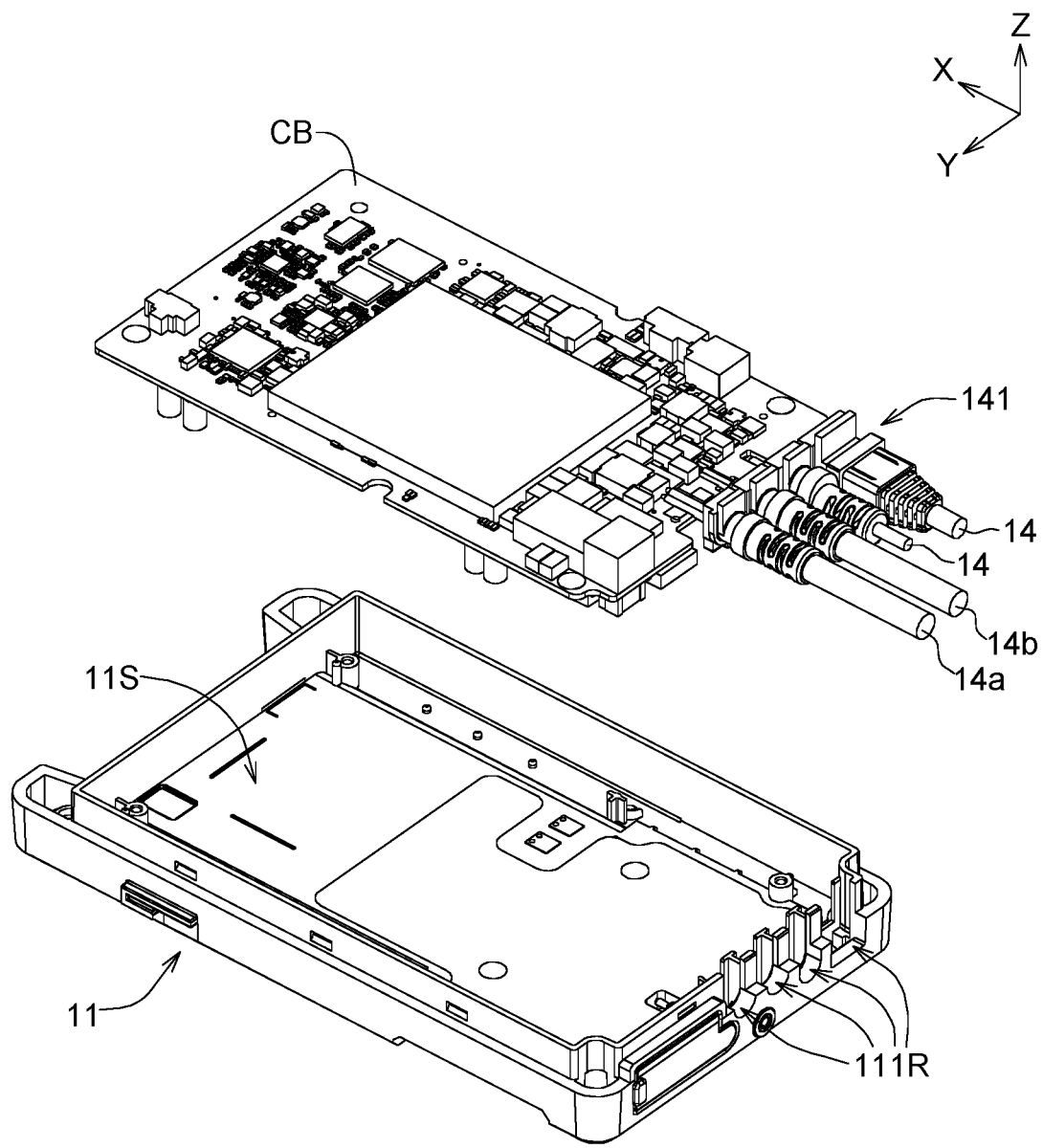
FIG. 5 is a schematic diagram of coupling the wire of the waterproof mechanism connected to the circuit board to the first casing.

Referring to FIG. 5, a schematic diagram of coupling the wire 14 of the waterproof mechanism 1 connected to the circuit board CB to the first casing 11 is shown. Through such arrangement, the engaging structure 141 of the wire 14 connected to the circuit board CB can be received in the receiving portion 111R in the negative direction of the Z-axis via the notch of the receiving portion 111R, such that the engaging structure 141 can be engaged with the first frame 111 of the first casing 11.

Figure 6:
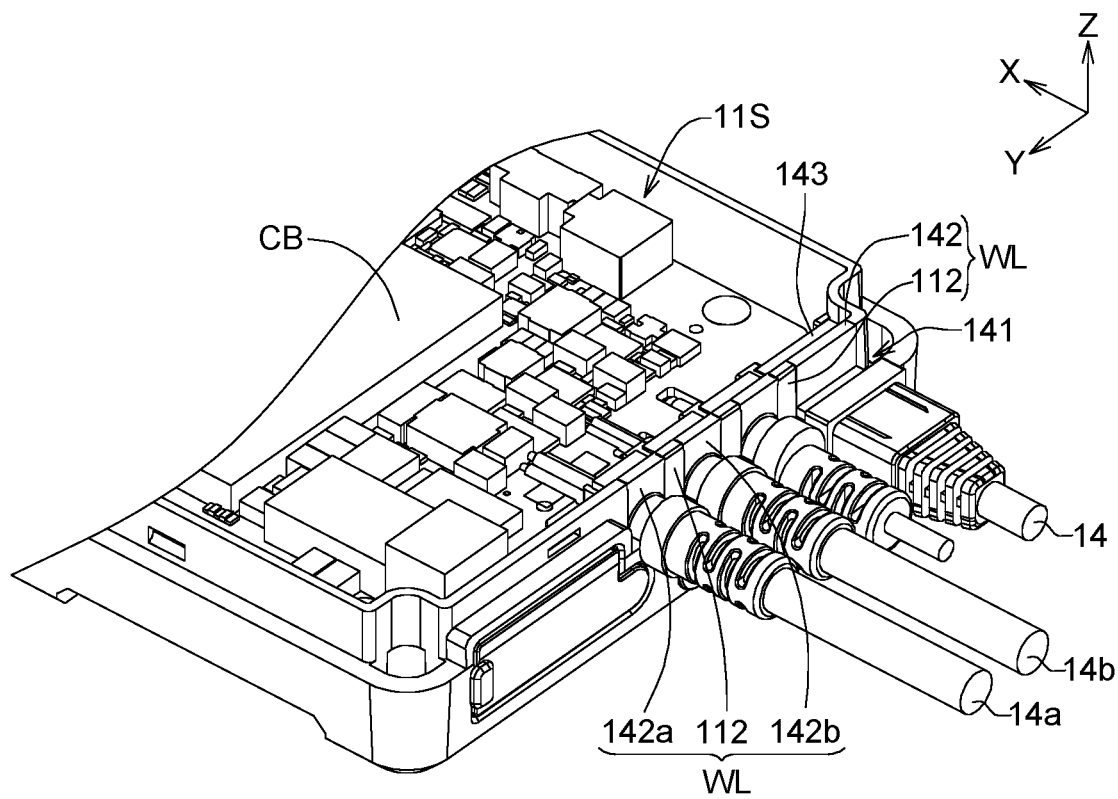
FIG. 6 is a 3D diagram of the assembly structure of FIG. 5.

Referring to FIG. 6, a 3D diagram of the assembly structure of FIG. 5 is shown. When the engaging structure 141 is engaged with the first frame 111 of the first casing 11, the engaging portion 142 is received in the opening portion 112R and fills up the gap caused by the opening portion 112R. For example, the engaging portion 142 is tightly engaged with the opening portion 112R. Thus, the engaging portion 142 and the first inner retaining wall 112 together form a closed retaining wall WL to avoid external objects entering the accommodation space 11S via the gap between the first frame 111 and the wire 14.

Besides, to enhance the coupling strength between the engaging structure 141 and the first frame 111 to avoid the wire 14 coming off towards the negative direction of the X-axis and damaging the coupling relationship between the engaging structure 141 and the first frame 111, in an embodiment, the engaging structure 141 may further include a limiting portion 143. Refer to FIG. 3, FIG. 4 and FIG. 6. The limiting portion 143 and the engaging portion 142 are connected. When the engaging portion 142 is received in the opening portion 112R, the limiting portion 143 is located in the space surrounded by the closed retaining wall WL. As indicated in FIG. 3, this space is located in the limiting groove 11R between the opening portion 112R and the accommodation space 11S. Under such circumstance, the opening portion 112R, the bearing portion 113R and the limiting groove 11R together form the receiving portion 111R for receiving the engaging structure 141 of the wire 14.

Figure 7A:
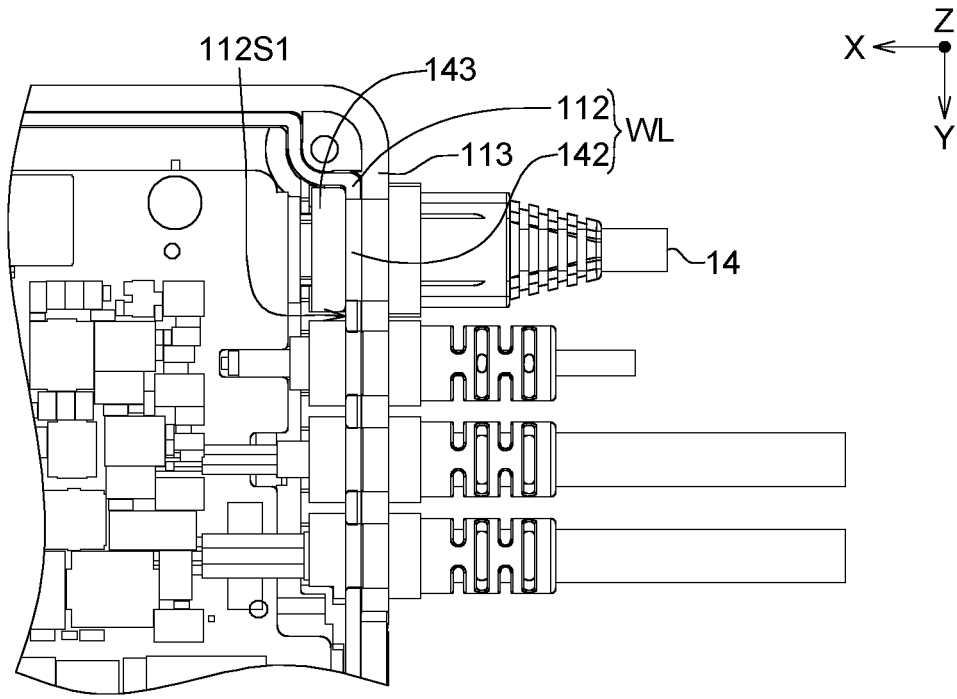
FIG. 7A is a top view of the assembly structure of FIG. 6.

Referring to FIG. 7A, a top view of the assembly structure of FIG. 6 is shown. When the engaging portion 142 and the first inner retaining wall 112 together form a closed retaining wall WL, the limiting portion 143 leans on the inner surface 112S1 of the first inner retaining wall 112. In other words, the length of the limiting portion 143 on the Y-axis is larger than the length of the engaging portion 142 on the Y-axis, such that the wire 14 will not come off towards the negative direction of the X-axis.

In the above embodiments, the waterproof mechanism 1 includes a wire 14. However, as disclosed above, the waterproof mechanism 1 can have multiple wires 14. As indicated in FIG. 4, the waterproof mechanism 1 may include a first wire 14a and a second wire 14b.

The first wire 14a includes a first engaging structure 141a and a first trace 145a. The first engaging structure 141a, like the engaging structure 141 of the wire 14, includes a first engaging portion 142a, a first clamping portion 144a and a first limiting portion 143a.

Similarly, the second wire 14b includes a second engaging structure 141b and a second trace 145b. The second engaging structure 141b, like the engaging structure 141 of the wire 14, includes a second engaging portion 142b, a second clamping portion 144b and a second limiting portion 143b.

In an embodiment, the first engaging structure 141a and the second engaging structure 141b respectively correspond to one receiving portion 111R and the other receiving portion 111R of the first frame 111. That is, the first engaging structure 141a and the second engaging structure 141b respectively correspond to a receiving portion 111R. The first engaging portion 142a of the first engaging structure 141a corresponds to the opening portion 112R of the one receiving portion 111R, and the second engaging portion 142b of the second engaging structure 141b corresponds to the opening portion 112R of the other receiving portion 111R, such that the first engaging portion 142a, the second engaging portion 142b and the first inner retaining wall 112 together form a closed retaining wall WL as indicated in FIG. 6. However, the present invention is not limited thereto.

Figure 7B:
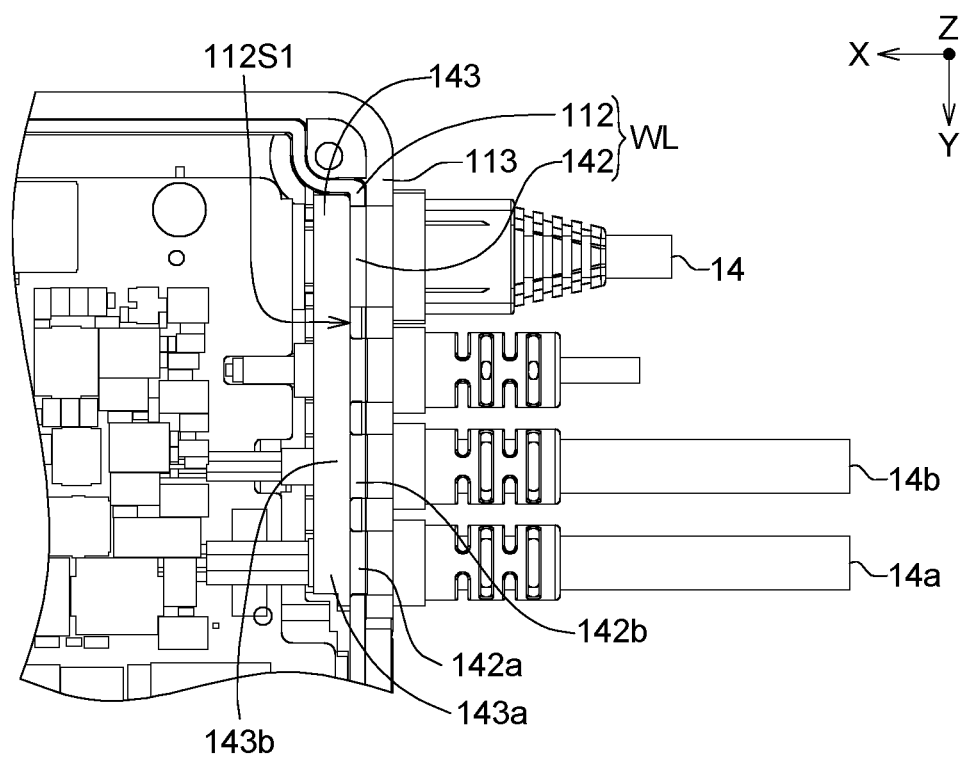
FIG. 7B is a top view of the assembly structure according to another embodiment of the present invention.

In another embodiment, as shown in FIG. 7B, the multiple wires 14 of the waterproof mechanism 1 can be integrally connected as one piece. Specifically, the engaging structure 141 of each of the wires 14 can be connected as a continuous structure. Under such circumstance, the first frame 111 forms a receiving portion 111R for receiving the engaging structure 141. Through such arrangement, the multiple wires 14 can be tightly arranged.

Figure 8A:
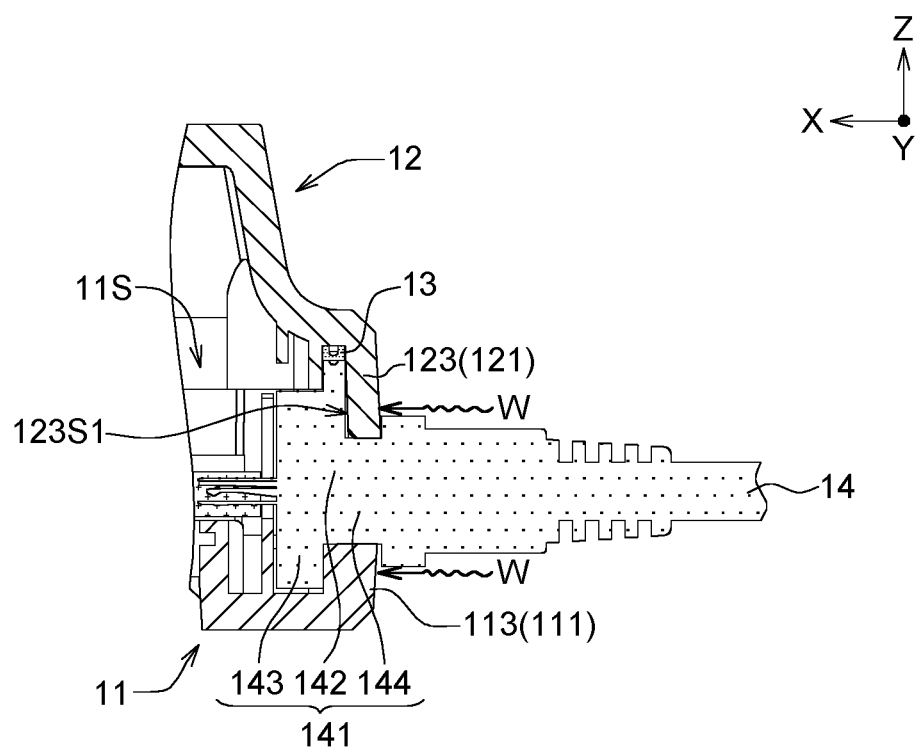
FIG. 8A is a cross-sectional view along the cross-sectional line 8A-8A' of FIG. 1.
Figure 8B:
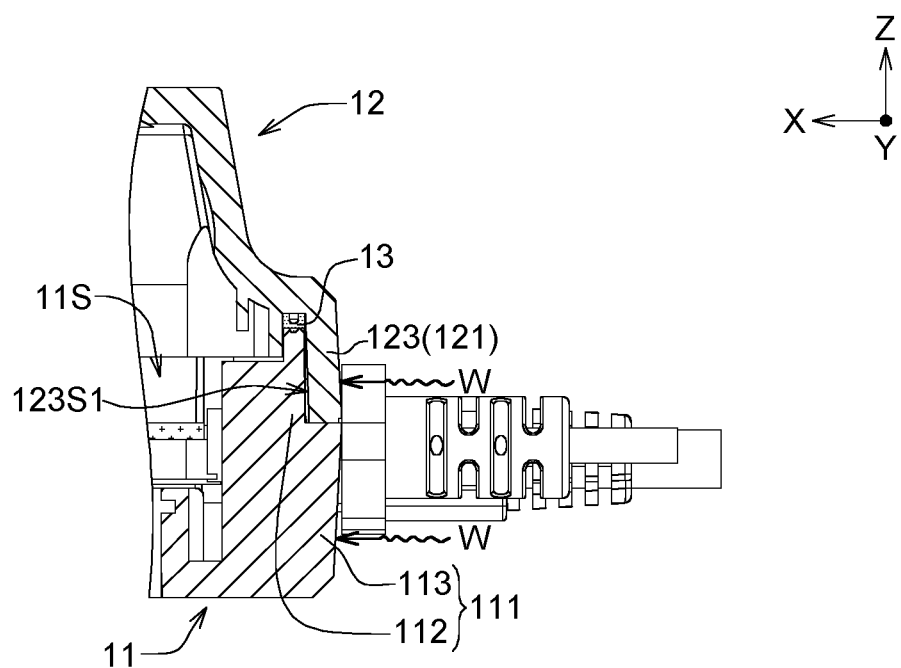
FIG. 8B is a cross-sectional view along the cross-sectional line 8B-8B' of FIG. 1.

FIG. 8A is a cross-sectional view along the cross-sectional line 8A-8A' of FIG. 1. FIG. 8B is a cross-sectional view along the cross-sectional line 8B-8B' of FIG. 1.

Referring to FIG. 2, FIG. 8A and FIG. 8B. The second frame 121 of the second casing 12 further includes a second outer retaining wall 123. The second outer retaining wall 123 corresponds to the first outer retaining wall 113 of the first frame 111 of the first casing 11. The groove 121R of the second frame 121 is adjacent to the second outer retaining wall 123.

After the assembly structure of FIG. 6 is formed, the first casing 11 and the second casing 12 (the waterproof strip 13 is already disposed in the groove 121R of the second frame 121) are coupled together. Meanwhile, the waterproof strip 13 is correspondingly disposed on the engaging portion 142, and the wire 14 is pressed by the waterproof strip 13 through the engaging portion 142 extended to the inside of the groove 121R as indicated in FIG. 8A. Meanwhile, the waterproof strip 13 is also correspondingly disposed on the first inner retaining wall 112, the first inner retaining wall 112 is extended to the inside of the groove 121R to press the waterproof strip 13 as indicated in FIG. 8B. In other words, the waterproof strip 13 is correspondingly disposed on the closed retaining wall WL (illustrated in FIG. 6). Thus, the second frame 121 tightly presses the waterproof strip 13, and the waterproof strip 13 is also tightly pressed by the closed retaining wall WL to avoid external objects W entering the accommodation space 11S via the closed retaining wall WL and the gap between the waterproof strip 13 and the second frame 121.

Moreover, the inner surface 123S1 of the second outer retaining wall 123 can lean on the closed retaining wall WL and the waterproof strip 13 to reduce the invasion of external objects W.

As disclosed in above embodiments, the waterproof mechanism of the present invention does not require a closed jack to be disposed on the frame of the casing for the wire to be horizontally inserted into the jack. Conversely, according to the waterproof mechanism of the present invention, the casing is divided into an upper casing and a lower casing that can be coupled together, and the wire is interposed between the two casings and engaged with the two frames of the two casings to provide a waterproof effect. The design of the waterproof mechanism of the present invention is different from the conventional design. Therefore, the waterproof mechanism of the present invention enables the electronic devices using the same to meet the waterproof requirement under the condition of miniaturization.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A waterproof mechanism comprising:
   a first casing comprising a first frame, the first frame comprising a first outer retaining wall and a first inner retaining wall having an opening portion;
   a second casing comprising a second frame having a groove and comprising a second outer retaining wall disposed corresponding to the first outer retaining wall;
   a wire interposed between the first casing and the second casing and comprising an engaging structure, the engaging structure comprising an engaging portion, the wire engaged with the first frame and the second frame through the engaging structure; and
   a waterproof strip disposed in the groove and corresponding to the first inner retaining wall, the waterproof strip pressed by the wire through the engaging portion extended into the groove, wherein the second outer retaining wall comprises an inner surface leaning on both of the engaging portion and the waterproof strip, and the engaging portion of the engaging structure has a shape matching the opening portion and is received in the opening portion, such that the engaging portion and the first inner retaining wall together form a closed retaining wall to press the waterproof strip.

2. The waterproof mechanism according to claim 1, wherein the engaging structure is tightly engaged with the first frame.

3. The waterproof mechanism according to claim 1, wherein the engaging structure further comprises a limiting portion connected to the engaging portion, wherein when the engaging portion is received in the opening portion, the limiting portion is located in the space surrounded by the closed retaining wall and leans on an inner surface of the first inner retaining wall.

4. The waterproof mechanism according to claim 1, wherein the inner surface of the second outer retaining wall further leans on the closed retaining wall.

5. The waterproof mechanism according to claim 1, wherein the first casing and the second casing are coupled together to form an accommodation space for receiving a circuit board, the first frame has a receiving portion whose notch faces the second casing, and the receiving portion is interconnected with the accommodation space and has a shape matching the engaging structure, wherein the engaging structure of the wire connected to the circuit board is received in the receiving portion via the notch, such that the engaging structure is engaged with the first frame.

6. The waterproof mechanism according to claim 1, wherein the waterproof mechanism further comprises a plurality of wires integrally connected as one piece.

7. The waterproof mechanism according to claim 1, wherein the waterproof mechanism further comprises a plurality of wires with different specifications.

8. A waterproof mechanism comprising:
   a first casing comprising a first frame, the first frame comprising a first outer retaining wall and a first inner retaining wall having a first opening portion;
   a second casing comprising a second frame having a groove and comprising a second outer retaining wall disposed corresponding to the first outer retaining wall;
   a first wire interposed between the first casing and the second casing and comprising a first engaging structure, the first engaging structure comprising a first engaging portion, the first wire engaged with the first frame and the second frame through the first engaging structure, wherein the first engaging portion has a shape matching the first opening portion and is received in the first opening portion, such that the first engaging portion and the first inner retaining wall together form a closed retaining wall; and
   a waterproof strip disposed in the groove and on the closed retaining wall, and pressed by the first wire through the first engaging portion extended into the groove and by the first inner retaining wall extended into the groove, wherein the second outer retaining wall comprises an inner surface leaning on both of the closed retaining wall and the waterproof strip.

9. The waterproof mechanism according to claim 8, wherein the first engaging structure further comprises a first limiting portion connected to the first engaging portion, wherein when the first engaging portion is received in the first opening portion, the first limiting portion is located in the space surrounded by the closed retaining wall and leans on an inner surface of the first inner retaining wall.

10. The waterproof mechanism according to claim 9, further comprising:
    a second wire integrally formed in one piece with the first wire and comprising a second engaging structure, wherein the second engaging structure comprises a second engaging portion and a second limiting portion connected to the second engaging portion, and the second engaging portion has a shape matching a second opening portion of the first inner retaining wall and is received in the second opening portion, such that the first engaging portion, the second engaging portion and the first inner retaining wall together form the closed retaining wall, wherein when the first engaging portion and the second engaging portion are received in the first opening portion and the second opening portion, the first limiting portion and the second limiting portion are located in the space surrounded by the closed retaining wall, and the first limiting portion and the second limiting portion lean on the inner surface of the first inner retaining wall.

11. The waterproof mechanism according to claim 8, wherein the first casing and the second casing are coupled together to form an accommodation space for receiving a circuit board, the first frame has a receiving portion whose notch faces the second casing, the receiving portion is interconnected with the accommodation space and has a shape matching the first engaging structure, and the first opening portion is a part of the receiving portion, wherein the first engaging structure of the first wire connected to the circuit board is received in the receiving portion via the notch, such that the first engaging portion is received in the first opening portion.

* * * * *